(12) United States Patent
Lee et al.

(10) Patent No.: US 6,972,262 B2
(45) Date of Patent: Dec. 6, 2005

(54) METHOD FOR FABRICATING SEMICONDUCTOR DEVICE WITH IMPROVED TOLERANCE TO WET CLEANING PROCESS

(75) Inventors: Sung-Kwon Lee, Ichon-shi (KR); Min-Suk Lee, Ichon-shi (KR)

(73) Assignee: Hynix Semiconductor Inc., (KR)

( * ) Notice: Subject to any disclaimer, the term of this patent is extended or adjusted under 35 U.S.C. 154(b) by 0 days.

(21) Appl. No.: 10/866,488

(22) Filed: Jun. 12, 2004

(65) Prior Publication Data

US 2005/0064727 A1 Mar. 24, 2005

(30) Foreign Application Priority Data

Sep. 22, 2003 (KR) ...................... 10-2003-0065691

(51) Int. Cl.[7] ...................... H01L 21/302; H01L 21/461
(52) U.S. Cl. ...................... 438/706; 438/740; 438/942
(58) Field of Search .............................. 438/706, 740, 438/745, 751, 781, 782, 942, 970

(56) References Cited

U.S. PATENT DOCUMENTS

| | | | |
|---|---|---|---|
| 5,989,983 A * | 11/1999 | Goo et al. | .................. 438/473 |
| 6,245,666 B1 * | 6/2001 | Ko et al. | .................... 438/623 |
| 6,340,735 B1 | 1/2002 | Yagihashi | |
| 6,607,991 B1 | 8/2003 | Livesay et al. | |
| 6,693,050 B1 | 2/2004 | Cui et al. | |

* cited by examiner

Primary Examiner—Phuc T. Dang
(74) Attorney, Agent, or Firm—Blakely Sokoloff Taylor & Zafman

(57) ABSTRACT

Disclosed is a method for fabricating a semiconductor device with an improved tolerance to a wet cleaning process. For a contact formation such as a gate structure, a bit line or a metal wire, a spin on glass (SOG) layer employed as an inter-layer insulation layer becomes tolerant to the wet cleaning process by allowing even a bottom part of the SOG layer to be densified during a curing process. The SOG layer is subjected to the curing process after a maximum densification thickness of the SOG layer is obtained through a partial removal of the initially formed SOG layer or through a multiple SOG layer each with the maximum densification thickness. After the SOG layer is cured, a self-aligned contact etching process is performed by using a photoresist pattern singly or together with a hard mask.

27 Claims, 10 Drawing Sheets

US 6,972,262 B2

METHOD FOR FABRICATING SEMICONDUCTOR DEVICE WITH IMPROVED TOLERANCE TO WET CLEANING PROCESS

FIELD OF THE INVENTION

The present invention relates to a method for fabricating a semiconductor device; and, more particularly, to a method for fabricating a semiconductor device with an improved tolerance to a wet cleaning process performed after a self-aligned contact etching process.

DESCRIPTION OF RELATED ARTS

A trend in a Large-scale of integration has brought a need to form semiconductor devices densely within a confined cell region. Thus, the size of unit devices of a semiconductor device, for instance, transistors and capacitors, has been gradually decreased. Particularly, in a dynamic random access memory (DRAM) device, the size of the unit devices formed within a cell region has been decreased as the design rule has been shifted towards minimization. For instance, DRAM devices are currently formed to have a minimum linewidth less than 0.1 µm and are often required to have a linewidth less than 80 nm. Hence, there exist many difficulties in applying conventional fabrication methods.

In case of applying a photolithography using ArF having a wavelength of 193 nm to a semiconductor device having a linewidth less than 80 nm, it is necessary to develop an additional recipe for preventing a photoresist deformation created during an etching process employed for the purposes of forming a fine pattern and a vertical etch profile.

Meanwhile, advancement in an integration level of a semiconductor device has led device elements to be formed in stacks. A contact plug or a contact pad is one example of such stack structure.

For the contact plug, a landing plug contact (LPC) is commonly used since the LPC has a bottom portion which makes a wide contact within a minimum area and a top portion which is wider than the bottom portion for increasing a contact margin.

A self-aligned contact (SAC) etching process is required to form such a LPC. The SAC etching process is a method of forming a contact by carrying out an etching process to a bottom semiconductor structure having a specific etch selectivity ratio. Generally, the SAC etching process uses materials having a different etch selectivity ratio, e.g., nitride and oxide.

Recent trends in large-scale of integration and minimization of the design rule make a distance between conductive patterns such as gate electrodes decreased, but a thickness of a conductive pattern conversely increased. As a result, an aspect ratio representing a ratio between a height and a width of a conductive pattern has been gradually augmented.

Therefore, it is required to develop a method for filling empty spaces generated by a high aspect ratio between the conductive patterns. For instance, borophosphosilicate glass (BPSG) is employed for such purpose since BPSG has an excellent gap-filling property. However, since BPSG requires a high thermal flow process proceeding at a temperature greater than 800° C., there arises a problem that the BPSG is diffused into lateral sides.

One of developing methods for resolving the above problem is a flowfill process which employs a flowfill insulation layer. Examples of the flowfill insulation layer are an advanced planarization layer (APL) and a spin on glass (SOG) layer, which is also called a spin on dielectric (SOD) layer.

For the SOG layer, it is essential to densify the SOG layer through a curing process at a temperature ranging from 600° C. to 700° C. However, a bottom part of the SOG layer is not sufficiently densified. Thus, the bottom part of the SOG layer becomes susceptible to a wet cleaning process performed after a contact formation process.

This problem will be described in detail with reference to the accompanying drawings.

FIGS. 1A and 1B are pictures of SEM in a cross-sectional view for comparing a conventional BPSG layer with a conventional SOG layer after a self-aligned contact (SAC) etching process and a subsequent wet cleaning process.

Particularly, FIG. 1A is a cross-sectional view showing the conventional BPSG layer used as an inter-layer insulation layer ILD1. As shown, there are not observed damages in the BPSG layer during the wet cleaning process using buffered oxide etchant (BOE) solution. Herein, the wet cleaning process is followed by the SAC etching process in order to secure a critical dimension (CD) of a bottom area of a contact and remove etch remnants.

FIG. 1B is a cross-sectional view showing the conventional SOG layer used as an inter-layer insulation layer ILD2. As shown, since a bottom part of the SOG layer is partially cured, the bottom part of the SOG layer is not sufficiently densified, thereby being easily damaged during the wet cleaning process. The reference denotation A expresses the damage created during the wet cleaning process. However, a top part of the SOG layer is almost intact. A thickness T of the SOG layer that can be completely cured is 4,000 Å.

FIGS. 2A and 2B are pictures of SEM in a top view for comparing a conventional BPSG layer with a conventional SOG layer obtained after a plug formation process.

Particularly, FIG. 2A is a cross-sectional view showing the conventional BPSG layer used as an inter-layer insulation layer ILD1. A polysilicon layer, is deposited on a substrate structure including a contact hole, formed by etching the inter-layer insulation layer ILD1, and is subsequently subjected to a chemical mechanical polishing (CMP) process. From this CMP process, a plurality of plugs P1 are formed. In case of employing the BPSG layer as the inter-layer insulation layer ILD1, there are not problems such as an electric short between the plugs P1 and degradation of an insulation property since the inter-layer insulation layer ILD1 is not affected by a wet cleaning process.

FIG. 2B is a cross-sectional view showing the conventional SOG layer used as an inter-layer insulation layer ILD2. As shown, a bottom part of the inter-layer insulation layer ILD2, i.e., the SOG layer, is damaged by a wet cleaning process, and this damaged bottom part of the inter-layer insulation layer ILD2 deteriorates an insulation property of the inter-layer insulation layer ILD2 disposed between plugs P2. There may be a problem of an electric short between the plugs P2 if this damage becomes more severe.

Therefore, it is necessitated to develop a method for preventing the inter-layer insulation layer, e.g., the SOG layer, from being damaged by a wet cleaning process since there is generated a difference in density caused by a limitation in curing the SOG layer up to a certain thickness.

SUMMARY OF THE INVENTION

It is, therefore, an object of the present invention to provide a method for fabricating a semiconductor device capable of preventing a spin on glass (SOG) layer from being damaged during a wet cleaning process due to a difference in densification caused by dependency on a thickness of the SOG layer subjected to a curing process.

In accordance with an aspect of the present invention, there is provided a method for fabricating a semiconductor device, including the steps of: forming a plurality of conductive patterns on a substrate provided with a cell region and a peripheral region; forming an etch stop layer on the plurality of conductive patterns and the substrate; forming a spin on glass (SOG) layer on the etch stop layer; performing a first curing process for densifying the SOG layer; partially etching the SOG layer to thereby make a bottom part of the SOG layer densified during a subsequent second curing process; performing the second curing process for densifying the SOG layer; forming a photoresist pattern on the SOG layer; forming a plurality of contact holes by etching the SOG layer with use of the photoresist pattern as an etch mask; removing portions of the etch stop layer exposed by the plurality of contact holes to thereby expose the substrate; and cleaning the contact holes.

In accordance with another aspect of the present invention, there is also provided a method for fabricating a semiconductor device, including the steps of: forming a plurality of conductive patterns on a substrate provided with a cell region and a peripheral region; forming an etch stop layer on the plurality of conductive patterns and the substrate; forming a first SOG layer on the etch stop layer, the first SOG layer having a thickness allowing a bottom part of the first SOG layer to be densified during a subsequent first curing process; performing the first curing process; forming a second SOG layer on the first SOG layer, the second SOG layer having a thickness allowing a bottom part of the second SOG layer to be densified during a subsequent second curing process; performing the second curing process; forming a photoresist pattern on the second SOG layer; forming a plurality of contact holes by etching the first and the second SOG layers with use of the photoresist pattern as an etch mask; removing portions of the etch stop layer exposed by the plurality of contact holes to thereby expose the substrate; and cleaning the contact holes.

In accordance with still another aspect of the present invention, there is also provided a method for fabricating a semiconductor device, including the steps of: forming a plurality of conductive patterns on a substrate provided with a cell region and a peripheral region; forming an etch stop layer on the plurality of conductive patterns and the substrate; forming a SOG layer on the etch stop layer; performing the first curing process for densifying the SOG layer; partially etching the SOG layer to thereby make a bottom part of the SOG layer densified during a subsequent second curing process; performing the second curing process; forming a layer of a hard mask material and an anti-reflective coating (ARC) layer on the SOG layer; forming a photoresist pattern on the ARC layer by employing an ArF photolithography; forming a plurality of contact holes by etching the SOG layer with use of the photoresist pattern as an etch mask; removing predetermined portions of the etch stop layer exposed by the plurality of contact holes to thereby expose the substrate; and cleaning the contact holes.

BRIEF DESCRIPTION OF THE DRAWINGS

The above and other objects and features of the present invention will become better understood with respect to the following description of the preferred embodiments given in conjunction with the accompanying drawings, in which.

DETAILED DESCRIPTION OF THE INVENTION

Hereinafter, a method for fabricating a semiconductor device with an improved tolerance to a wet cleaning process in accordance with preferred embodiments of the present invention will be described in detail with reference to the accompanying drawings.

Figure 1A:
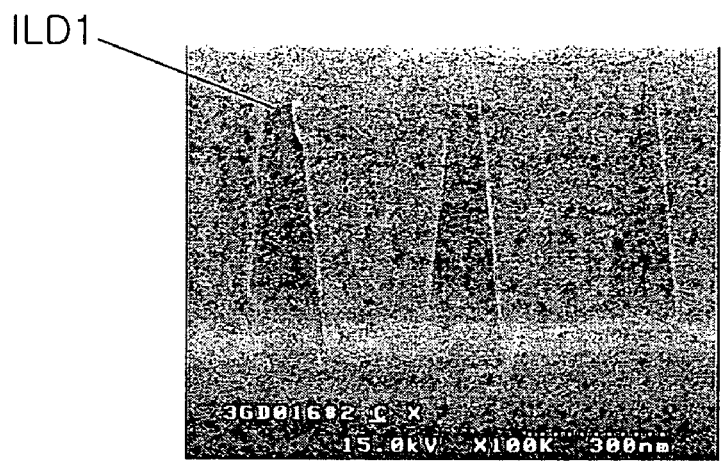
FIG. 1A is a picture of scanning electron microscopy (SEM) showing a cross-sectional view of a conventional BPSG layer obtained after a SAC etching process and a subsequent wet cleaning process.
Figure 1B:
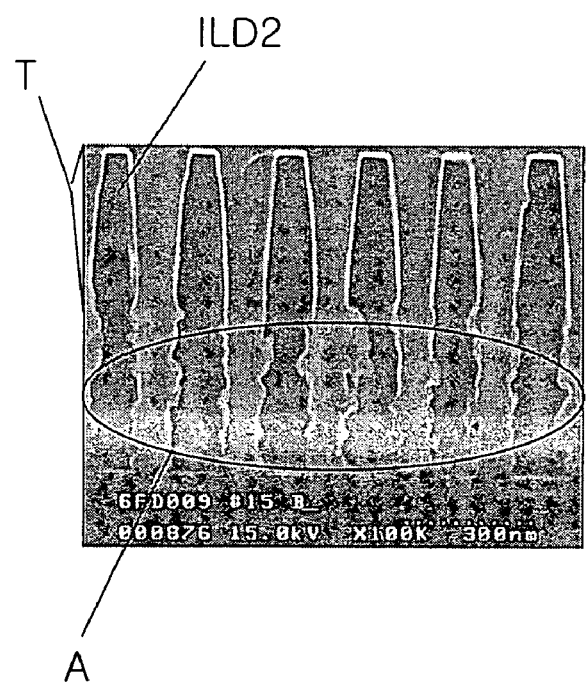
FIG. 1B is a picture of SEM showing a cross-sectional view of a conventional SOG layer obtained after a SAC etching process and a subsequent wet cleaning process.
Figure 2A:
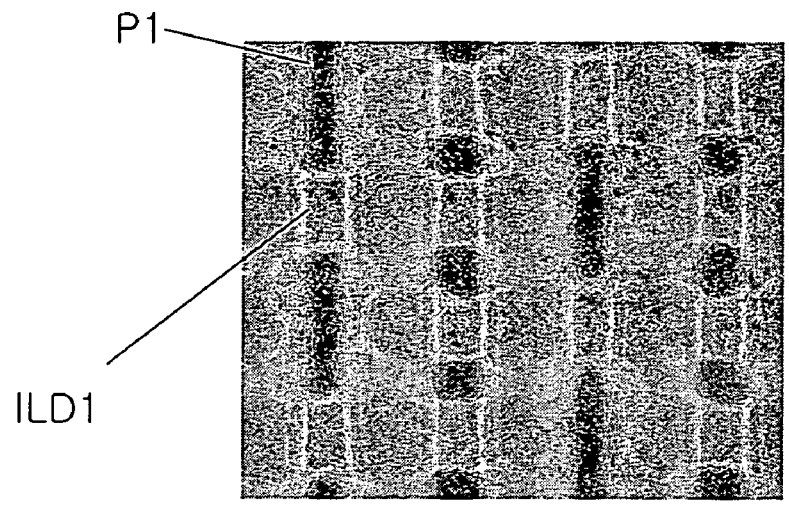
FIG. 2A is a picture of SEM showing a cross-sectional view of a conventional BPSG layer obtained after a plug formation process.
Figure 2B:
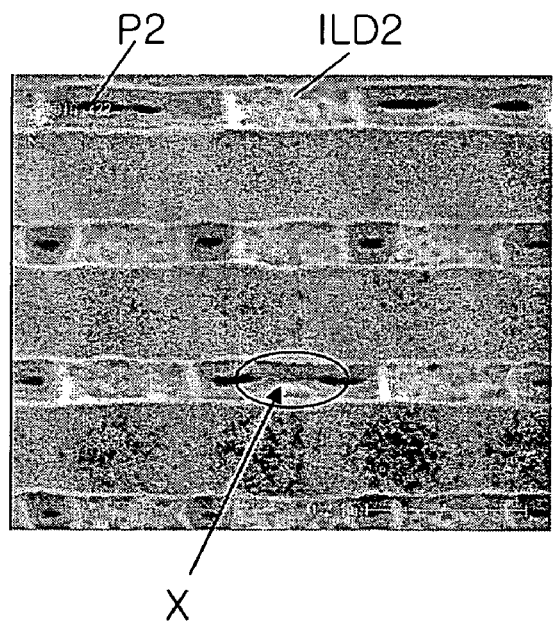
FIG. 2B is a picture of SEM showing a cross-sectional view of a conventional SOG layer obtained after a plug formation process.
Figure 3:
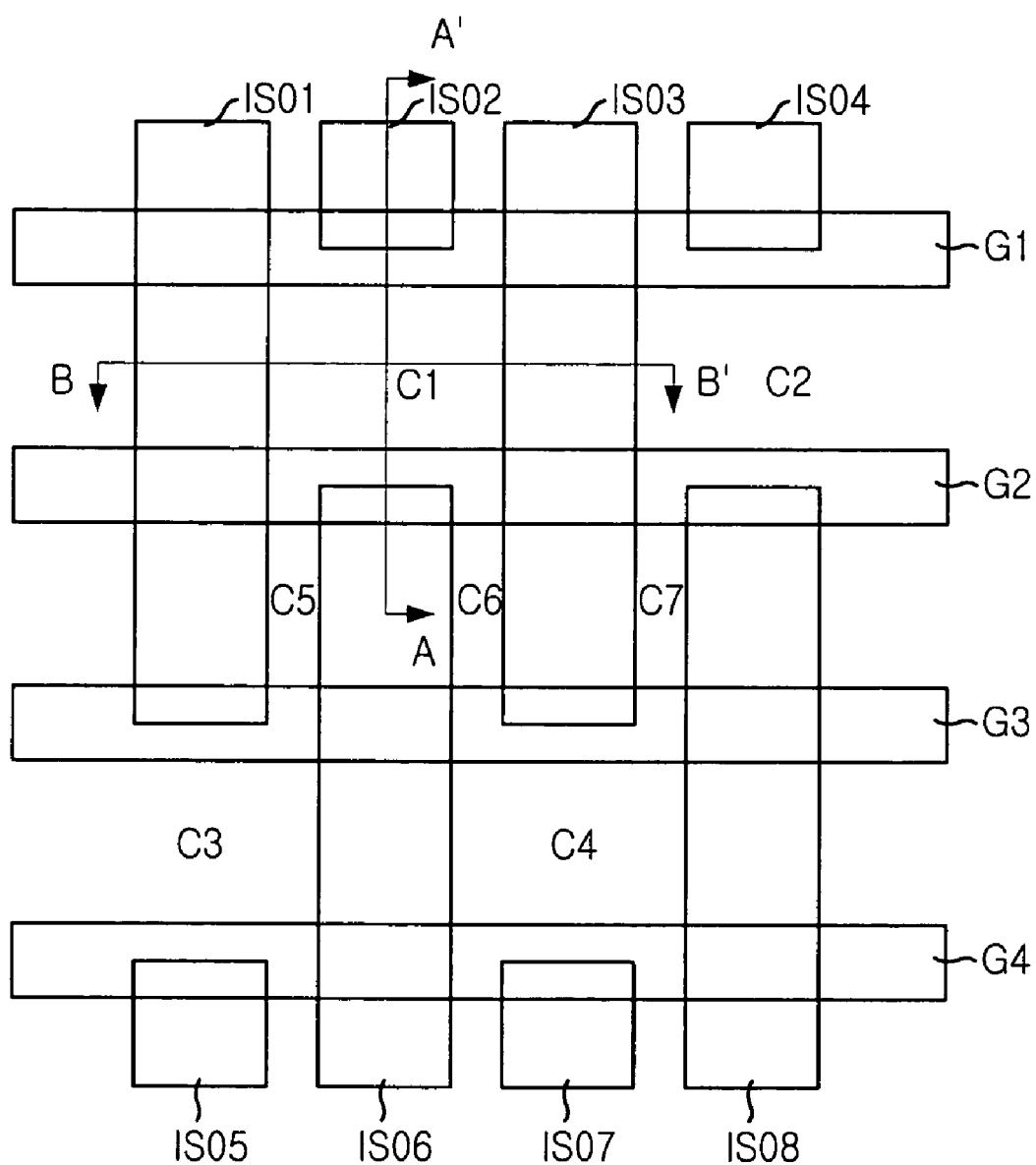
FIG. 3 is a top view showing a layout of a semiconductor device obtained after a self-aligned contact (SAC) etching process for forming a landing plug contact in accordance with the present invention.

FIG. 3 is a top view showing a layout in which a self-aligned contact (SAC) etching process for forming landing plug contacts is completed.

As shown, a plurality of gate structures G1 to G4 are formed with a uniform distance on a semi-finished substrate structure. Although not illustrated, the semi-finished substrate structure is prepared by forming device elements such as a well and a field oxide layer into a substrate. In a crossing direction to the plurality of gate structures G1 to G4, a plurality of bar-type isolation patterns ISO1 to ISO8 are formed. Also, there are a plurality of contact holes C1 to C7 between the gate structures G1 to G4 isolated by the bar-type isolation patterns ISO1 to ISO8.

Herein, some of the contact holes from C1 to C4 represent bit line contact regions, while the rest of the contact holes from C5 to C7 represent storage node contact regions.

Hereinafter, more detailed descriptions on the method for fabricating a semiconductor device with an improved tolerance to a wet cleaning process will be provided by referring to the diagrams showing respective cross-sectional views of FIG. 3 in each direction of a line A–A' and a line B–B'.

FIGS. 4A to 4E are cross-sectional views showing a method for forming a pattern in a semiconductor device in accordance with a first embodiment of the present invention.

Although a process for forming contact hole patterns are exemplified in the first embodiment of the present invention, the contact hole patterns can be still applicable in such processes for forming a contact pad, a metal line contact, and a contact with an impurity junction, e.g., a source/drain, for a bit line contact or a storage node contact.

Figure 4A:
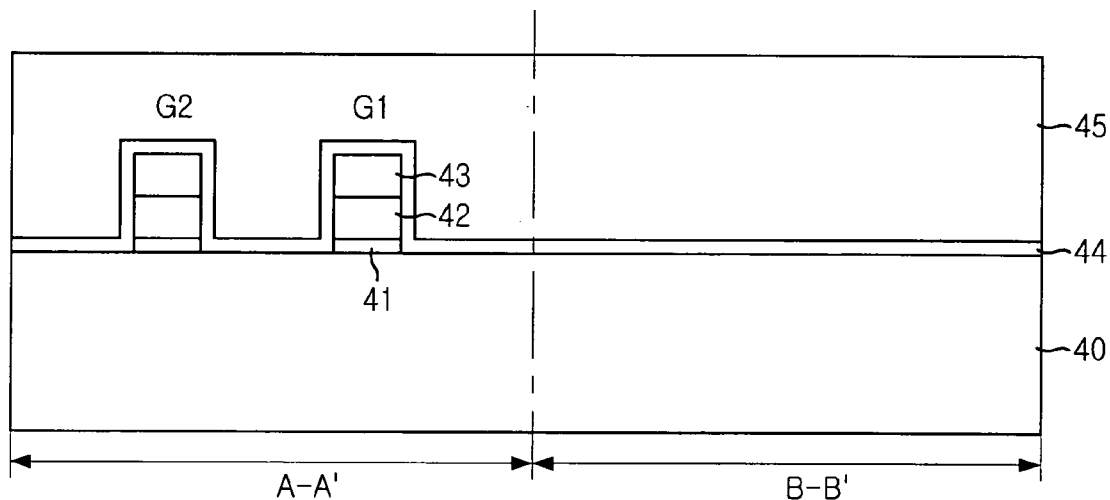
FIGS. 4A to 4E are cross-sectional views illustrating a method for forming a pattern in accordance with a first embodiment of the present invention.

Referring to FIG. 4A, a plurality of gate structures G1 and G2 are formed on a substrate 40. Herein, each of the gate electrodes G1 and G2 is formed by sequentially stacking a gate insulation layer 41, a gate conductive layer 42 and a gate hard mask 43.

Also, the gate insulation layer 41 is made of an oxide-based material such as silicon oxide. The gate conductive layer 42 is made of a single material or a combined material selected from a group consisting of polysilicon, tungsten (W), tungsten nitride ($WN_x$), and tungsten silicide ($WSi_x$).

The gate hard mask 43 serves to prevent the gate conductive layer 42 from being damaged in the course of forming contact holes by etching an inter-layer insulation layer which will be subsequently formed. Thus, the gate hard mask 43 is made of a material having a different selectivity with respect to the inter-layer insulation layer. For instance, if the inter-layer insulation layer is made of an oxide-based material, the gate hard mask 43 is made of a nitride-based material such as silicon oxynitride (SiON) or a silicon nitride (SiN). If the inter-layer insulation layer is made of a polymer-based low dielectric material, the gate hard mask 43 is made of an oxide-based material.

Although not illustrated, the substrate 40 is prepared by forming precedently a field oxide layer and a well. Also, impurity diffusion regions such as source/drain junctions are formed between the gate structures G1 and G2.

More specifically, an ion implantation process is carried out in alignment to the gate structures G1 and G2, so that the substrate 40 is ion implanted with impurities. Afterwards, a spacer is formed each sidewall of the gate structures G1 and G2, and an ion implantation process is performed again to thereby form a lightly doped drain (LDD) structure. Herein, more detailed descriptions on formations of the impurity diffusion region, the LDD structure and the spacer are omitted.

Next, an etch stop layer 44 is formed on the substrate 40 and the gate structures G1 and G2 for the purpose of preventing the substrate 40 from being damaged during a subsequent SAC etching process. At this time, it is preferable to form the etch stop layer 44 along a profile of the gate structures G1 and G2. The etch stop layer 44 is made of a nitride-based material such as silicon nitride or silicon oxynitride.

A spin on glass (SOG) layer is formed on an entire surface of the resulting structure. Herein, the SOG layer 45 is used as the aforementioned inter-layer insulation layer. Particularly, the SOG layer 45 is formed to improve a gap-fill property which might be degraded because of an increase in an aspect ratio between the gate structures G1 and G2.

Figure 4B:
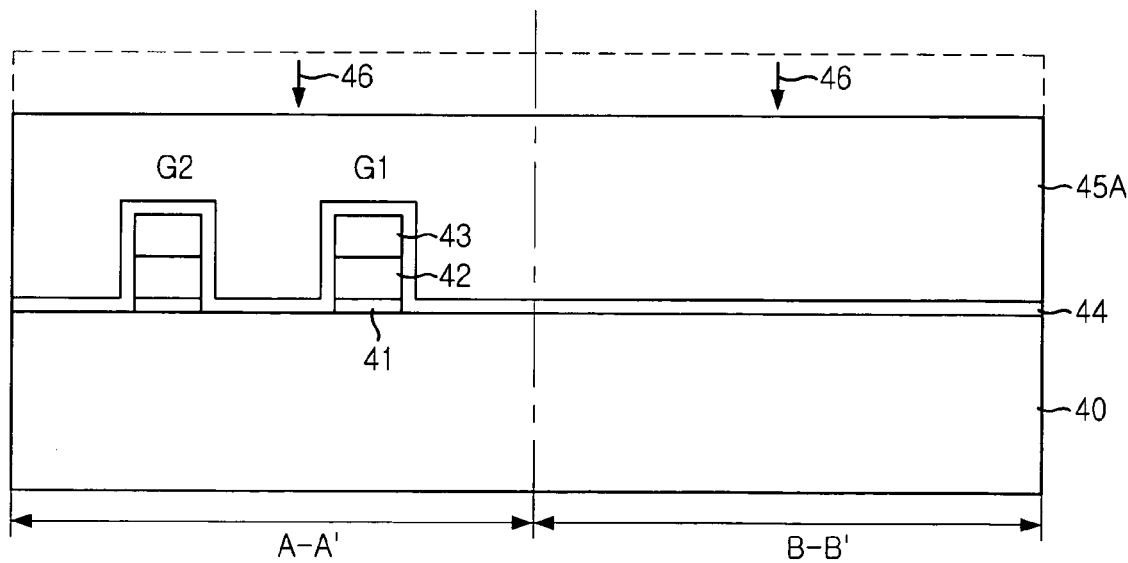

Referring to FIG. 4B, the SOG layer 45 is partially etched until a thickness of the SOG layer 45 is approximately 4,000 Å, which is a maximum thickness that the SOG layer 45 can be cured by a curing process. As a result of this partial removal of the SOG layer 45, it is possible to densify even a portion of the SOG layer 45 on an upper part of the etch stop layer 44 disposed between the gate structures G1 and G2. Herein, the reference numbers 46 and 45A denote this partial removal of the SOG layer 45 and the remaining SOG layer, respectively.

Figure 4C:
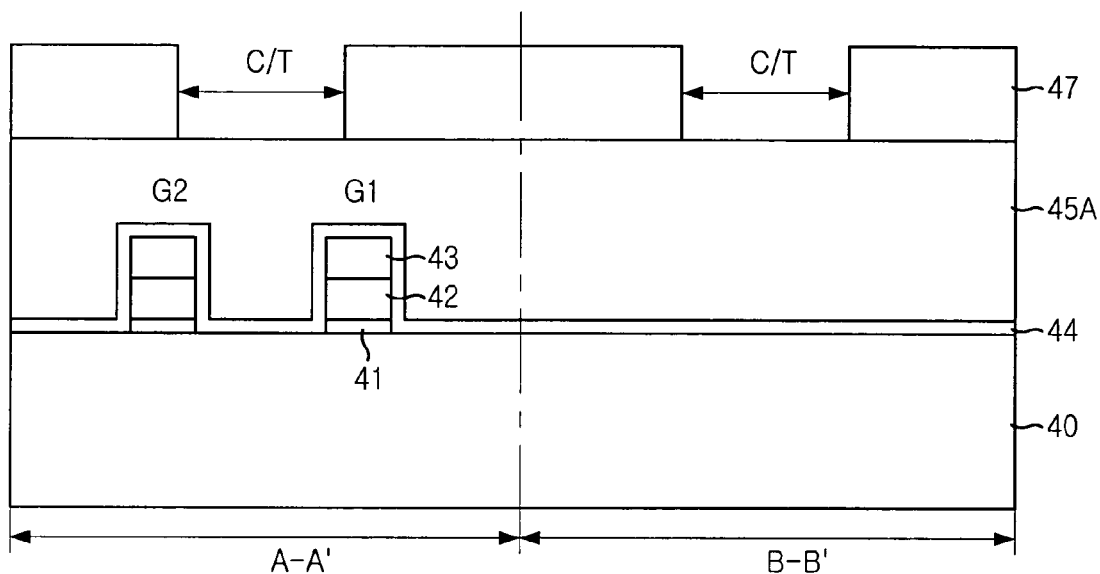

Referring to FIG. 4C, a photoresist pattern 47 for defining contact hole regions C/T for forming landing plug contacts (LPCs) is formed on predetermined portions of the remaining SOG layer 45A.

In more detail of the photoresist pattern formation, a photoresist is formed on the remaining SOG layer 45A and is then selectively photo-exposed by using a predetermined reticle (not shown) for defining a width of a contact hole and a lithography device such as KrF, ArF or $F_2$ device. Then, a developing process makes photo-exposed portions or non-photo-exposed portions remain. Thereafter, a cleaning process is performed to remove etch remnants, so that a photoresist pattern 47 for forming a LPC is formed.

It is also possible to form an anti-reflective coating layer between the photoresist pattern 47 and the remaining SOG layer 45A in order to prevent formation of undesired patterns caused by scattering reflection due to a high index of reflection of the remaining SOG layer 45A and to improve adhesiveness between the remaining SOG layer 45A and the photoresist pattern 47. The anti-reflection coating layer is made of an organic material having a similar etch characteristic with the photoresist pattern 47.

Figure 4D:
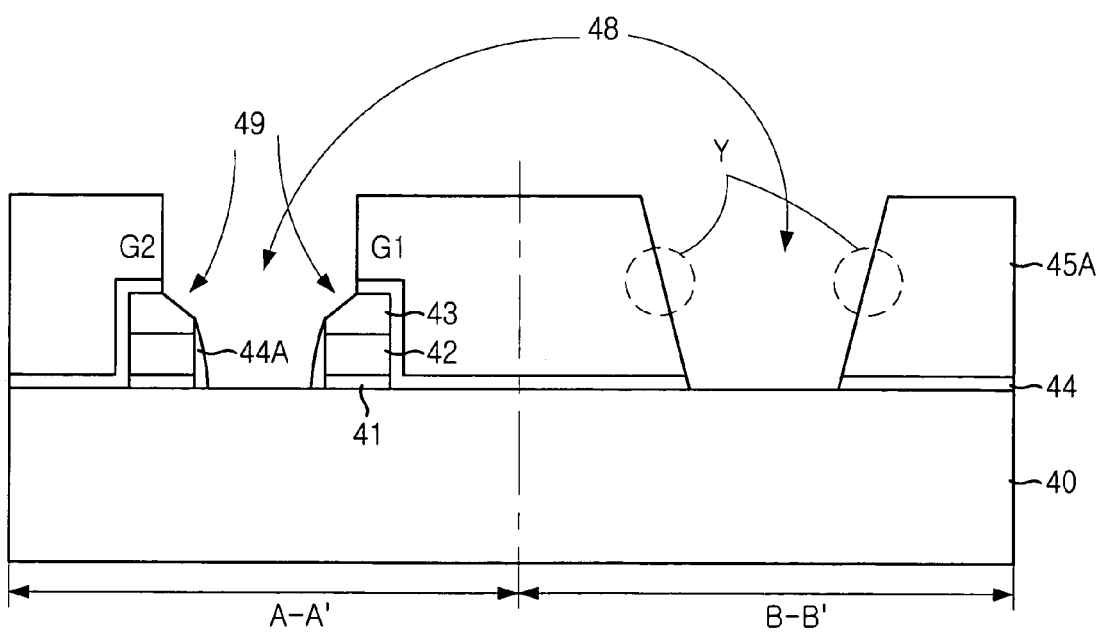

Referring to FIG. 4D, the remaining SOG layer 45A is etched by using the photoresist pattern 47 shown in FIG. 4D as an etch mask to expose predetermined portions of the etch stop layer 44, e.g., a portion disposed between the gate structures G1 and G2. This etching process is called the SAC etching process. From this SAC etching process, a plurality of contact holes 48 are formed.

At this time, the remaining SOG layer 45A is etched by employing typical recipes for the SAC etching process. That is, examples of a mainly used etch gas are $CF_4$, $C_4F_6$, $C_4F_8$, $CH_2F_2$ or $C_5F_8$, and such a carrier gas as He, Ne or Ar is added to the selected main etch gas.

Afterwards, portions of the exposed etch stop layer 44 are removed by performing a blanket etch process to thereby expose predetermined portions of the substrate 40, more particularly, the impurity diffusion regions. At this time, the etch stop layer 44 encompassing the gate structures G1 and G2 remains as a spacer 44A.

Then, the photoresist pattern 47 shown in FIG. 4C is removed by employing a typical photoresist stripping process. Herein, the reference number 49 denotes damages occurring to the gate hard mask 43 during the SAC etching process and the blanket etch process.

A wet cleaning process using a cleaning solution such as buffer oxide etchant (BOE) is performed to secure a critical dimension (CD) of each bottom of the contact holes 48 and remove etch remnants reaming after the SAC etching process and the blanket etch process.

Meanwhile, since even the bottom part of the remaining SOG layer 45A can be densified, the remaining SOG layer 45A becomes increasingly tolerant to the cleaning solution. Thus, there is not observed a damage to an etch profile of the remaining SOG layer 45A. This effect is denoted as 'Y' in FIG. 4D.

Figure 4E:
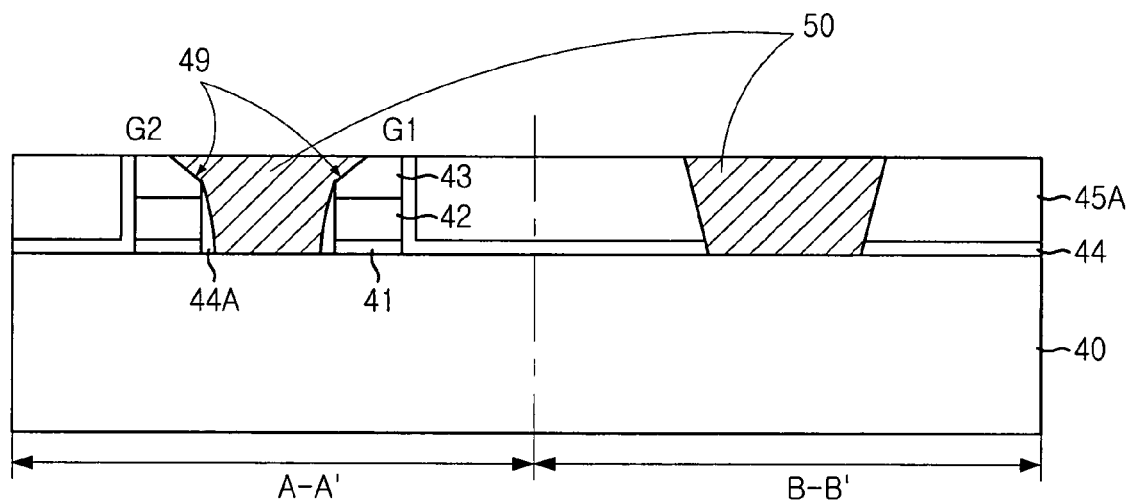

Referring to FIG. 4E, a conducting layer for forming plugs 50 is formed on an entire surface of the above resulting structure until the conducting layer is filled into the contact holes 48. The conducting layer is typically a single layer of polysilicon, or a stack layer of polysilicon and barrier metal such as Ti or TiN. Also, it is still possible to use tungsten instead of polysilicon for the conducting layer. Also, the plugs 50 can be formed by employing a selective epitaxial growth (SEG) method.

Then, a chemical mechanical polishing (CMP) process is performed under a target of exposing the gate hard mask 43, so that the plugs 50 are formed. Herein, the plugs 50 are planarized and are electrically connected with the impurity diffusion regions of the substrate 40.

More specific to the planarization process, the conducting layer is subjected to an etch-back process to reduce a difference in height of device elements in a cell region and a peripheral region, so that the CMP process can be performed more effectively. The CMP process is then performed to planarize the conducting layer for forming the plugs 50. Herein, instead of performing the CMP process under a target of planarizing the gate hard mask 43, it is possible to perform the CMP process until a portion of the remaining SOG layer 45A partially remains.

Figure 5:
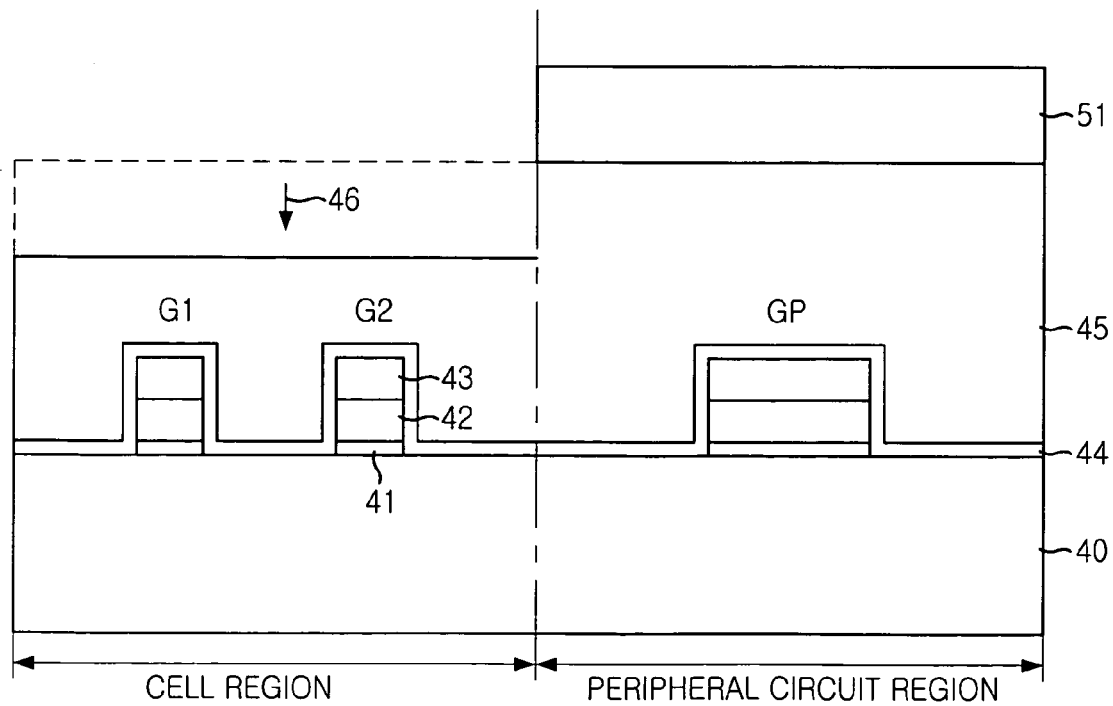
FIG. 5 is a detailed cross-sectional view for describing a removal of a spin on glass (SOG) layer shown in FIG. 4B in accordance with the first embodiment of the present invention.

FIG. 5 is a detailed cross-sectional view for describing the partial removal of the SOG layer 45 shown in FIG. 4B in accordance with the first embodiment of the present invention.

As shown, a photoresist pattern 51 opens the SOG layer 45 in the cell region, while masking the SOG layer 45 in the peripheral region. Then, the SOG layer 45 in the cell region is partially removed until a remaining thickness of the SOG layer 45 is approximately 4,000 Å. The reference number 46 denotes this partial removal of the SOG layer 45 in the cell region. At this time, it is preferable to control the SAC etching process in a manner to achieve the remaining thickness of the SOG layer 45 in a range from approximately 3,000 Å to approximately 5,000 Å.

That is, a first curing is performed after the formation of the SOG layer 45. Then, the SOG layer 45 in the cell region is partially removed, and a second curing process is performed thereafter. The first and the second curing processes proceed at a temperature ranging from approximately 600° C. to approximately 700° C. for approximately 10 minutes to approximately 60 minutes. At this time, the first and the second curing processes proceed in an atmosphere of a single gas or a combined gas selected from a group consisting of $H_2O$, $O_2$, $N_2$, $H_2$, and $N_2O$.

In accordance with the first embodiment of the present invention, the first curing process is performed to the SOG layer 45 formed as the inter-layer insulation layer. Then, the second curing process is performed to the remaining SOG layer 45A having a maximum curing thickness of approximately 4,000 Å obtained by partially removing the SOG layer 45 in the cell region. The second curing process makes even the bottom part of the remaining SOG layer 45A densified, and thus, it is possible to prevent the remaining SOG layer 45A from being damaged during the wet cleaning process.

In a high resolution photolithography process using an ArF lithography device, a photoresist pattern alone cannot accomplish its function as an etch mask, and the thickness of the photoresist pattern also needs to be reduced. Thus, a hard mask commonly made of a material selected from a group consisting of polysilicon, tungsten, amorphous carbon and nitride is used.

Particularly, the hard mask made of nitride is more advantageous in a SAC etching process. Hereinafter, more detailed explanation on advantages of the nitride-based hard mask will be provided.

FIGS. 6A to 6D are cross-sectional views showing a method for forming a pattern in a semiconductor device in accordance with a second embodiment of the present invention. In the second embodiment of the present invention, the same reference numbers will be used for the same constitution elements described in the first embodiment of the present invention, and detailed description on formation of such elements will be omitted.

Figure 6A:
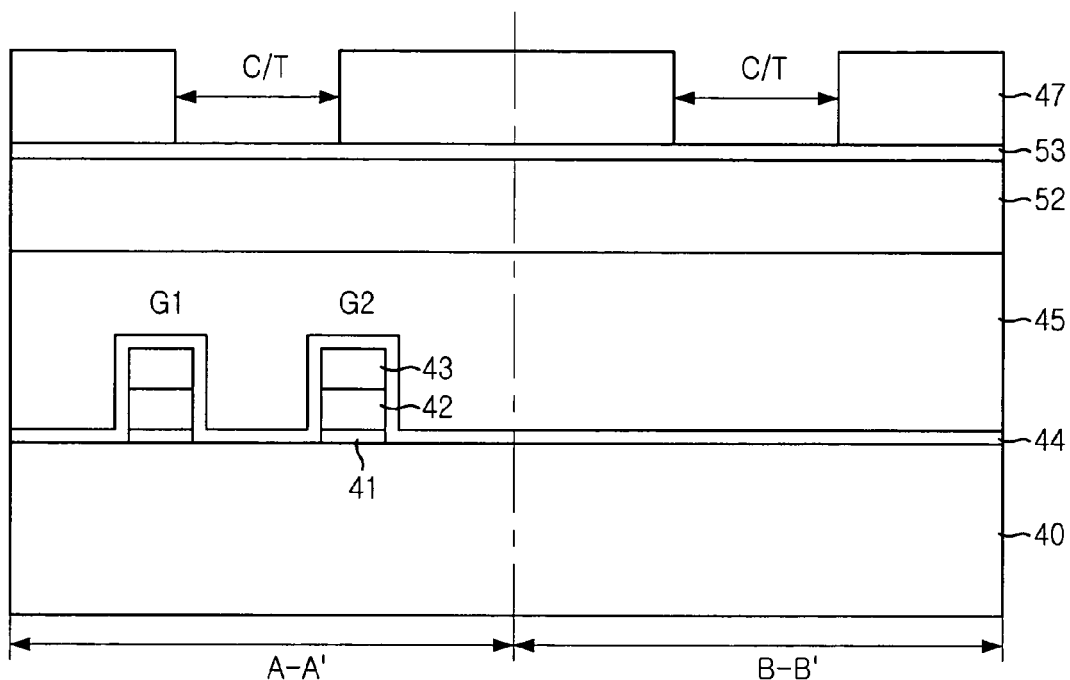
FIGS. 6A to 6D are cross-sectional views illustrating a method for forming a pattern in accordance with a second embodiment of the present invention.

Referring to FIG. 6A, a SOG layer 45 employed as an inter-layer insulation layer is formed on a semi-finished semiconductor structure including a substrate 40, a plurality of gate structures G1 and G2 and an etch stop layer 44. Each of the gate structures G1 and G2 has a gate insulation layer 41, a gate conductive layer and a gate hard mask 43. Particularly, the SOG layer 45 is formed to improve a gap-fill property which might be degraded because of an increase in an aspect ratio between the gate structures G1 and G2.

Subsequently, a nitride layer 52 is formed on the SOG layer 45 that is partially removed. Herein, the nitride layer 52 is made of an insulating material and is simultaneously used as a hard mask since the nitride layer 52 has a different etch selectivity from the SOG layer 45.

It is preferable to form the nitride layer 52 by using a plasma enhanced nitride layer and a low pressure nitride layer. Also, a thickness of the nitride layer 52 is determined in consideration of a lost portion of the nitride layer 52 during a SAC etching process and another lost portion of the nitride layer 52 during an etching of an etch stop layer 44 for exposing impurity diffusion regions. That is, the nitride layer 52 preferably has a thickness equal to or greater than a predetermined value allowing the nitride layer 52 to be removed naturally in situ during the etching of the etch stop layer 44. Also, the thickness of the nitride layer 52 is variable depending on types of a reticle and the size of a device.

For instance, in a sub 100 nm device, the thickness of the nitride layer 52 ranges from approximately 500 Å to approximately 800 Å by considering the lost portions of the nitride layer 52 each having a thickness of approximately 300 Å in the course of performing the aforementioned etching processes.

An anti-reflective coating layer 53 is formed to prevent undesired patterns from being formed because of scattering reflection caused by a high index of reflection of the nitride layer 52 and improve adhesiveness between a photoresist 47, which will be subsequently formed, and the nitride layer 52. Herein, the anti-reflective coating layer 53 is preferably made of an organic material having a similar etch characteristic with the photoresist pattern 47. It is possible to omit the formation of the anti-reflective coating layer 53 depending on intended processes.

Next, the photoresist pattern 47 for defining contact hole regions C/T for forming LPCs is formed on predetermined portions of the SOG layer 45.

In more detail of the photoresist pattern formation, a photoresist is formed on the SOG layer 45 and is then selectively photo-exposed by using a predetermined reticle (not shown) for defining a width of a contact hole and a lithography device such as KrF, ArF or $F_2$ device. Then, a developing process makes photo-exposed portions or non-photo-exposed portions remain. Thereafter, a cleaning process is performed to remove etch remnants, so that the photoresist pattern 47 for forming LPCs is formed.

Meanwhile, when if polysilicon or tungsten having a high index of reflection is used as a hard mask material, there is a problem of detecting an overlay, thereby requiring an additional alignment key opening process for a mask alignment. However, there is not a difficulty in aligning masks since the nitride layer 52 having a lower index of reflection than polysilicon and tungsten is employed as the hard mask material in the second embodiment of the present invention.

Also, since the photoresist pattern 47 needs to be formed with a thin thickness enough to etch the thin nitride layer 52, it is possible to form much well-defined fine patterns and thus to prevent the patterns from being collapsed.

Hence, the photoresist pattern 47 can be applicable in a sub 80 nm semiconductor technology. For instance, a thickness of the photoresist pattern 47 in a semiconductor technology with a minimum linewidth of approximately 80 nm is expected to be approximately 1,500 Å. A minimum thickness of the photoresist pattern 47 required for etching the nitride layer 52 having a thickness of approximately 700 Å is expected to be approximately 1,000 Å, and thus, the above photoresist pattern 47 can used in a sub 80 nm semiconductor technology.

Figure 6B:
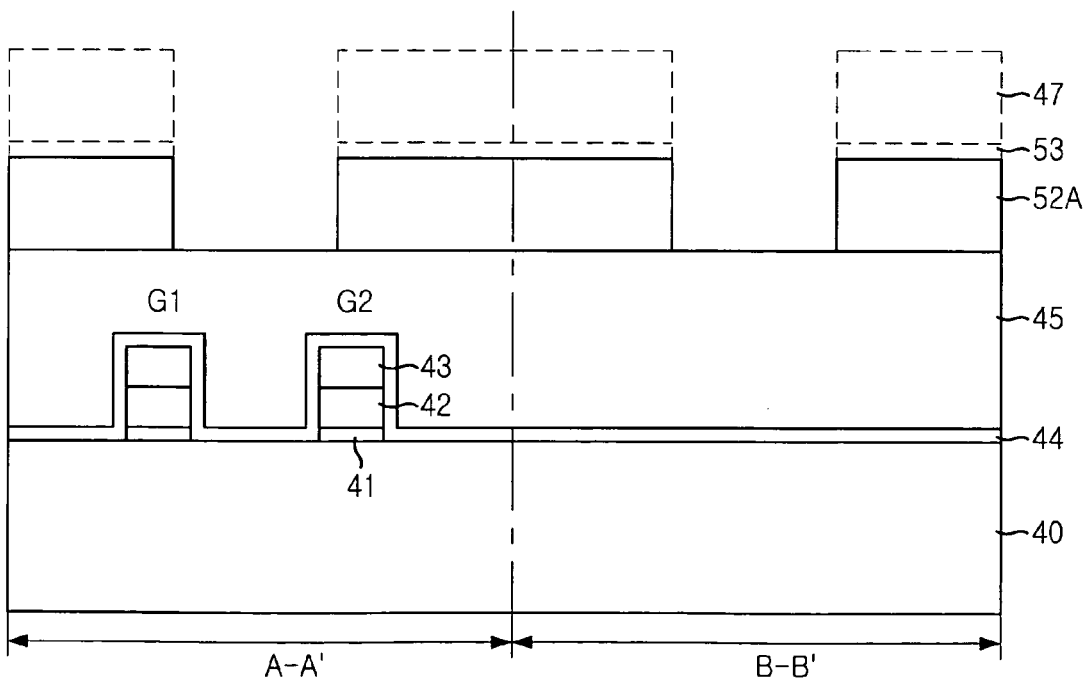

Referring to FIG. 6B, the anti-reflective coating layer 53 and the nitride layer 52 are etched by using the photoresist pattern 47 as an etch mask to form a hard mask 52A.

Additionally, in case of an ArF photolithography process, it is very difficult to set up an appropriate process recipe for forming a pattern by etching a line-type nitride layer. Thus, it is important to provide a process recipe apt for a nitride layer having a thickness less than approximately 1,000 Å.

Especially, such a process recipe capable of overcoming disadvantages like pattern striation and deformation should be applied for the etching of the nitride layer 52. Especially, the following conditions should be met in order to achieve the above intended effect: they are, an electrode with a low temperature, a specifically designed equipment providing an independent control of a plasma source and a bias, and an extremely low bias power.

One preferable process recipe is experimentally provided by Tokyo Electron Limited (TEL) with use of the super capacitive coupled plasma module (SCCM) equipment. For instance, a source power of approximately 1,000 W and a bias power of approximately 200 W are supplied along with a chamber pressure of approximately 50 mTorr. Also, $O_2$ and $CF_4$ having a respective quantity of approximately 20 sccm and approximately 100 sccm are supplied. At this time, a temperature of an electrode is approximately 0° C.

This experimentally provided process recipe is important to form the hard mask 52A since the anti-reflective coating layer 53 made of an oxide-based material and the nitride layer 52 can be simultaneously etched according to this process recipe. Also, it is possible to control a critical dimension (CD) of the hard mask 52A, which is a bar-type pattern, through controlling etch gases and etch time. This control of the CD of the hard mask 52A makes it possible to increase a margin for securing a CD of each bottom of contact holes during a subsequent SAC etching process.

The photoresist pattern 47 is removed by an ashing process. If the anti-reflective coating layer 53 is made of an organic material, the anti-reflective coating layer 53 is simultaneously removed by the ashing process. Herein, the ashing process is one of a photoresist stripping process and an oxygen plasma treatment. It is important to remove clearly the photoresist pattern 47 in order to prevent generation of pattern defects during the subsequent SAC etching process.

Figure 6C:
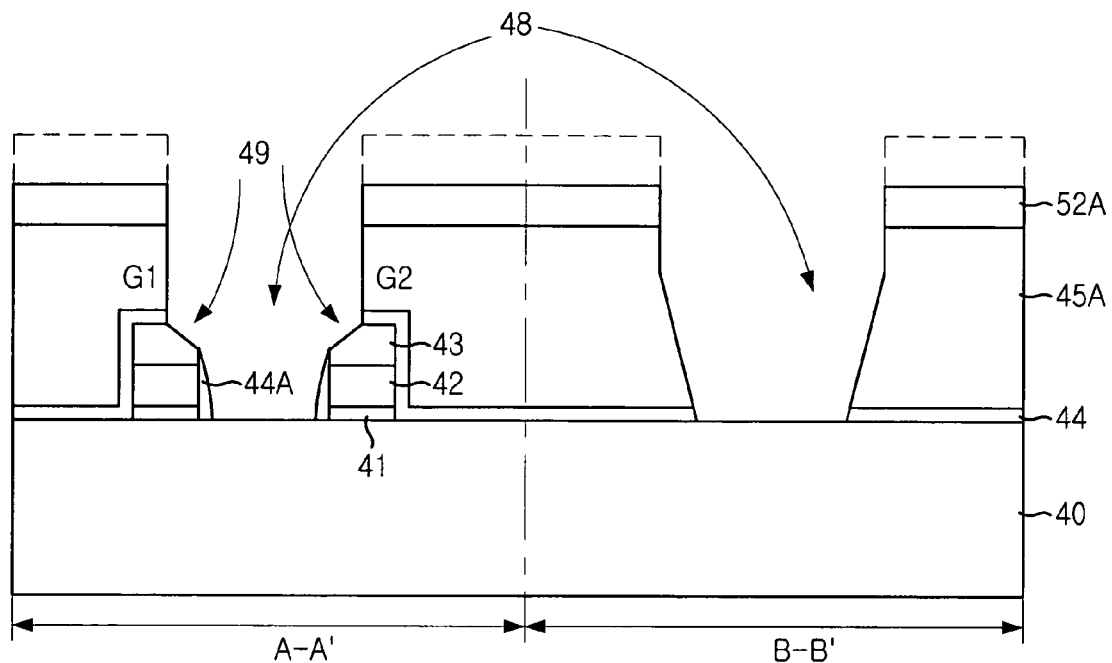

Referring to FIG. 6C, the SOG layer 45 shown in FIG. 6B is etched by using the hard mask 52A as an etch mask to thereby form a plurality of contact holes 48 exposing predetermined portions of the etch stop layer 44, e.g., a portion disposed between the gate structures G1 and G2. This etching process is the above mentioned SAC etching process. Also, the reference number 45A and 44A denotes the SOG layer remaining after the SAC etching process and a spacer remaining on sidewalls of the gate structures G1 and G2 after the blanket etching process.

At this time, since the SOG layer 45 shown in FIG. 6B can be etched without considering a case of pattern deformation, a recipe providing characteristics of the SAC etching process that maximizes a selectivity of the SOG layer 45 with respect to the hard mask 52A and sufficiently secures a CD of each bottom of the contact holes 48 is applied.

Also, it is essential to use a gas that provides a higher etch selectivity than a typical gas used in a SAC etching process because a carbon source is limitedly supplied due to a characteristic of the photoresist pattern 47. Thus, a gas that generates lots of $CF_2$ radicals such as $C_4F_6$ or $C_5F_8$ is used instead of $C_4F_8$ typically used in the SAC etching process.

Also, since it may become difficult to sufficiently secure the required CD of the bottom of each contact hole 48, a recipe for the SAC etching process needs to be set appropriately to correct this potential problem. That is, a temperature of an electrode is approximately 40° C. to improve the etch selectivity, and oxygen is added to sufficiently secure the CD of the bottom of each contact hole 48.

More specifically, one preferable recipe for the SAC etching process is experimentally provided by TEL with use of the SCCM equipment. That is, a respective source power and a bias power of approximately 500 W and 1200 W are supplied along with a chamber pressure of approximately 40 mTorr. Also, such gases as Ar and $O_2$ are supplied with a respective quantity of approximately 800 sccm and approximately 5 sccm. At this time, an electrode temperature is approximately 40° C.

Compared with the case of performing a SAC etching process using only a photoresist pattern as an etch mask, the loss of the gate hard mask 43 decreases even if approximately 300 Å of the gate hard mask 43 that is lost during the SAC etching process is considered. Thus, it is unnecessary to form a capping layer on the gate structures G1 and G2 with use of an undoped silicate glass (USG) layer in order to protect the gate hard mask 43.

In more detail, in case that the capping layer is applied in a device with a minimum linewidth of approximately 100 nm, it is required to control more precisely a thickness of the capping layer and a wet cleaning process since there are frequent incidences of a failure in controlling a process for forming the capping layer. Also, it is possible to omit the capping layer formation process due to its inapplicability in a device with a minimum linewidth less than approximately 80 nm due to an overhang problem.

As a result of the above effect on the omission of the capping layer formation, it is possible to achieve a process simplification and prevent incidences of an unopened contact usually caused by a non-uniform capping layer in the course of etching an etch stop layer for opening contacts.

Next, the exposed etch stop layer 44 is removed by performing a blanket etch process to thereby expose the substrate 40, more particularly, the impurity diffusion regions. At this time, a thickness of the lost portion of the gate hard mask 43, which is approximately 300 Å, is nearly the same as the thickness of the exposed etch stop layer 44 removed by the blanket etch process.

Although it is highly preferable to naturally remove the hard mask 52A in situ during the etching of the exposed etch stop layer 44, the hard mask 52A still remains after the removal of the exposed etch stop layer 44 in an actual practice.

Meanwhile, it is possible to carry out a series of LPC formation processes in situ at the same equipment by employing the hard mask 52A made of an insulating nitride material. For instance, in case that an equipment having two chambers is used, in one chamber with a built-in photoresist stripper, a photoresist stripping process proceeds after a hard mask is formed by etching a nitride layer through the use of an ArF photolithography process. In another chamber, a SAC etching process and another etching process with respect to an etch stop layer are carried out. If this type of the equipment is used, it is preferable to load the semiconductor structure in which the photoresist pattern 47 is formed on the substrate 40 as shown in FIG. 6B into such equipment.

Also, in case that a conducting material such as polysilicon or tungsten is used as a hard mask, it is necessary to perform etching processes at different chambers. However, the use of the insulating nitride material as the hard mask 52A can solve this problem and attributes to a shortening of turnaround time (TAT) when in the application of mass production.

Figure 6D:
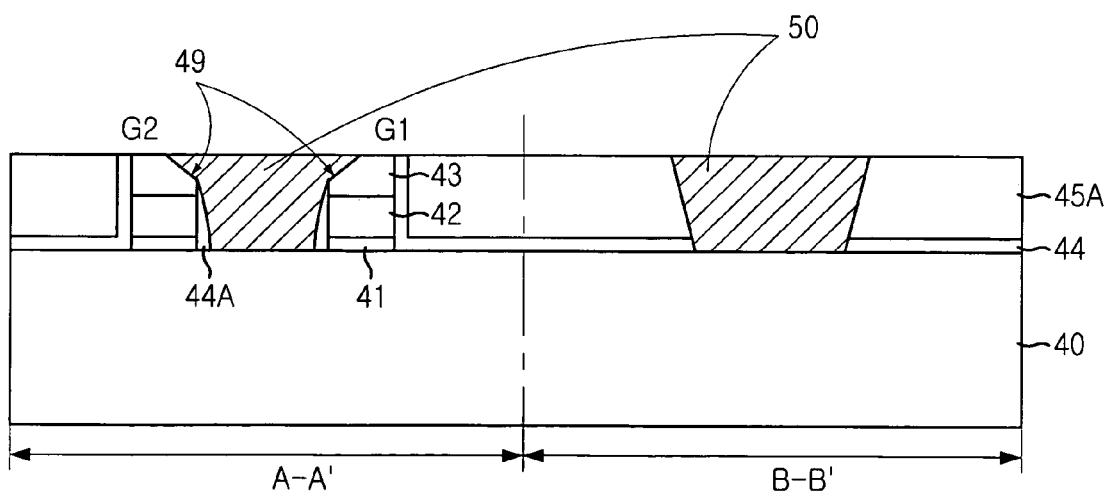

Referring to FIG. 6D, there are a plurality of plugs 50 electrically connected with the impurity diffusion regions of the substrate 40 through the contact holes 48. Herein, the plugs 50 are formed by performing the same processes described in FIG. 4E.

In accordance with the second embodiment of the present invention, it is possible to form fine patterns by using the insulating nitride material for forming the hard mask when the high resolution ArF photolithography is applied.

FIGS. 7A to 7D are cross-sectional views for forming a pattern in a semiconductor device in accordance with a third embodiment of the present invention. Herein, the same reference numbers used in the first embodiment of the present invention will be used for the same constitution elements, and detailed description on formation of such elements will be omitted.

Figure 7A:
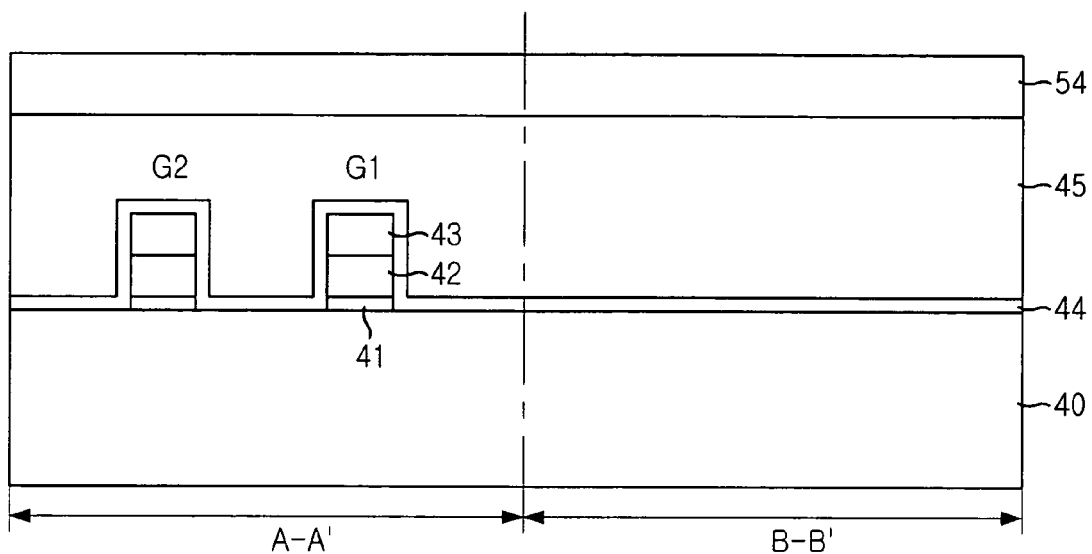
FIGS. 7A to 7D are cross-sectional views illustrating a method for forming a pattern in accordance with a third embodiment of the present invention.

Referring to FIG. 7A, a first SOG layer 45 is formed on a substrate structure in which gate structures G1 and G2 are formed and is then subjected to a first curing process. A second SOG layer 54 is formed on the first SOG layer 45 and is then subjected to a second curing process.

At this time, unlike the first and the second embodiments which exemplify the cases of forming the SOG layer which is, in turn, subjected to the etching process, the first SOG layer 45 and the second SOG layer 54 are formed with a respective thickness equal to or less than approximately 4,000 Å, and the first and the second curing processes are performed respectively after the first and the second SOG layers 45 and 54 are formed.

Therefore, the first and the second SOG layers 45 and 54 individually have a thickness ranging from approximately 3,000 Å to approximately 5,000 Å. The first and the second curing processes are performed at a temperature ranging from approximately 600° C. to approximately 700° C. for approximately 10 minutes to approximately one hour by using an ambient gas selected in single or in combination from a group consisting of $H_2O$, $O_2$, $N_2$, $H_2$ and $N_2O$.

Figure 7B:
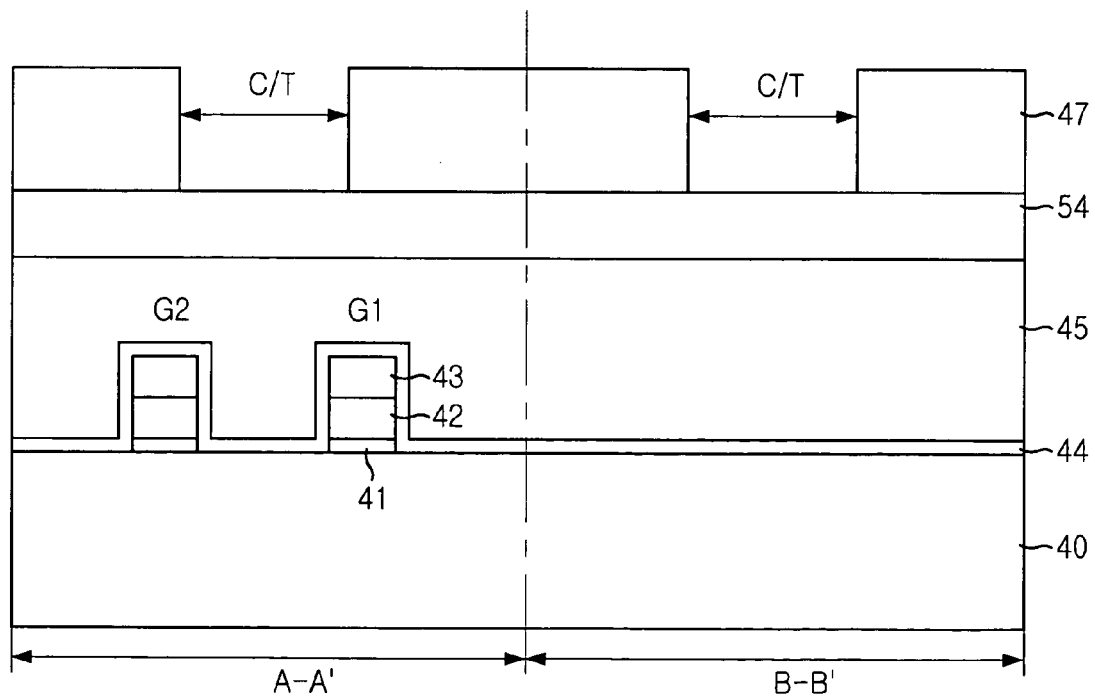

Referring to FIG. 7B, a photoresist pattern 47 for defining contact hole regions C/T for forming LPCs is formed on predetermined portions of the second SOG layer 54.

In more detail of the photoresist pattern formation, a photoresist is formed on the second SOG layer 54 and is then selectively photo-exposed by using a predetermined reticle (not shown) for defining a width of a contact hole and a lithography device such as KrF, ArF or $F_2$ device. Then, a developing process makes photo-exposed portions or non-photo-exposed portions remain. Thereafter, a cleaning process is performed to remove etch remnants, so that a photoresist pattern 47 for forming a LPC is formed.

It is also possible to form an anti-reflective coating layer between the photoresist pattern 47 and the second SOG layer 54 in order to prevent formation of undesired patterns caused by scattering reflection due to a high index of reflection of the second SOG layer 54 and to improve adhesiveness between the second SOG layer 54 and the photoresist pattern 47. The anti-reflection coating layer is made of an organic material having a similar etch characteristic with the photoresist pattern 47.

Figure 7C:
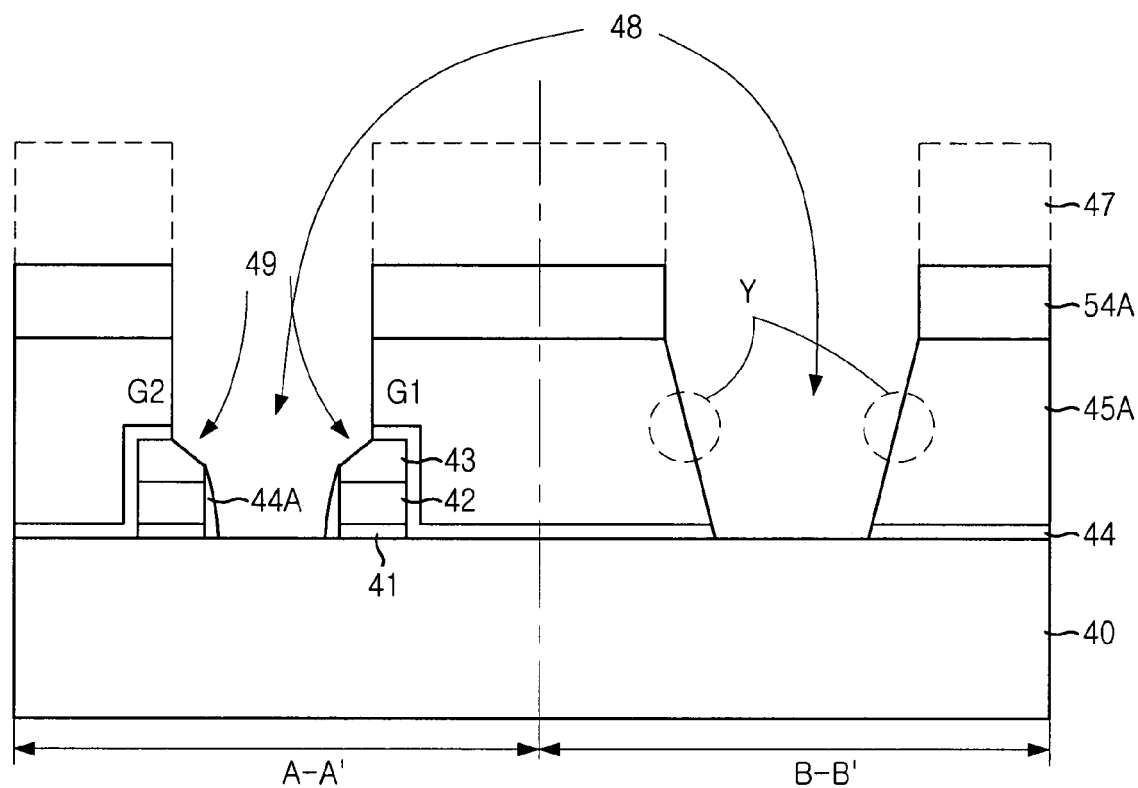

Referring to FIG. 7C, the second SOG layer 54 and the first SOG layer 45 shown in FIG. 7B is etched by performing a SAC etching process with use of the photoresist pattern 47 as an etch mask. From this SAC etching process, a plurality of contact holes 48 exposing predetermined portions of the etch stop layer 44 are formed. Herein, the reference numbers 45A, 54A and 44A represent the first SOG layer and the second SOG layer remaining after the SAC etching process, respectively.

Afterwards, the exposed etch stop layer 44 is removed, thereby exposing the substrate 40. Especially, a blanket etch process is employed for the removal of the exposed etch stop layer 44. At this time, the etch stop layer 44 encompassing the gate structures G1 and G2 remains as a spacer 44B.

Next, the photoresist pattern 47 is removed by employing a common photoresist stripping process. Herein, the reference number 49 denotes damages occurring to the gate hard mask 43 during the SAC etching process and the blanket etch process.

After the photoresist pattern 47 is removed, a wet cleaning process is performed to secure a sufficient CD of each bottom of the contact holes 48 and remove etch remnants remaining after the SAC etching process and the blanket etch process. At this time, such a cleaning solution as buffer oxide etchant (BOE) is used.

Since even bottom parts of the first remaining SOG layer 45A and the second remaining SOG layer 54A are densified, the first remaining SOG layer 45 and the second remaining SOG layer 54 have an improved tolerance to the above cleaning solution. Thus, the first remaining SOG layer 45A and the second remaining SOG layer 54A are not damaged during the wet cleaning process. The reference denotation Y expresses this described effect.

Figure 7D:
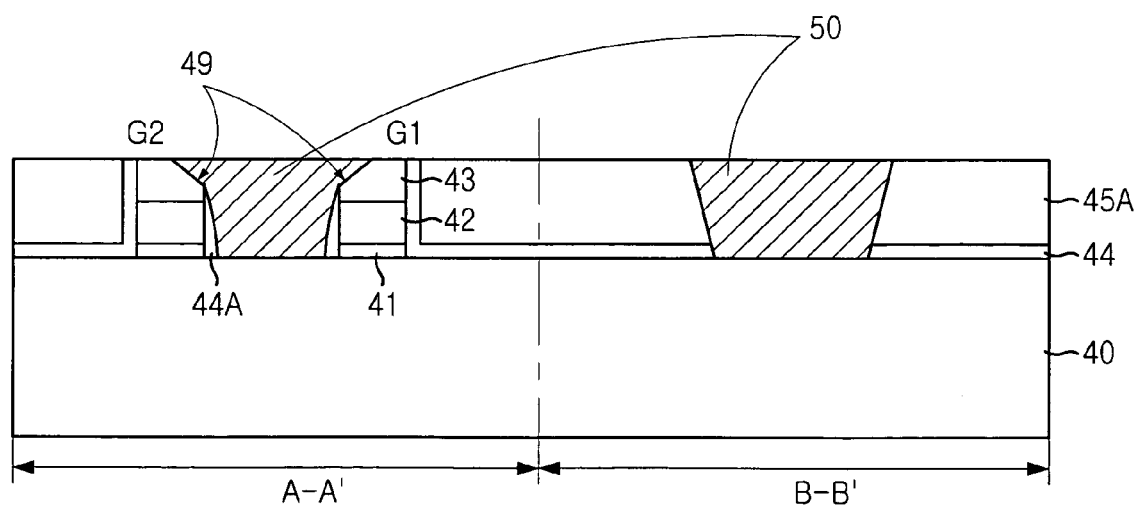

Referring to FIG. 7D, there are a plurality of plugs 50 electrically connected with the substrate 40 through the contact holes 48. Herein, the plugs 50 are formed by performing the same processes described in the first and the second embodiments.

In accordance with the third embodiment of the present invention, the first curing process and the second curing process are performed, respectively after the formations of the first SOG layer and the second SOG layer each having a thickness of approximately 4,000 Å, which is a maximum thickness to which the SAC etching process can be stably performed. Thus, it is possible to prevent the SOG layers from being damaged during the wet cleaning process because of the densified bottom parts of the first and the second SOG layers.

Although the third embodiment of the present invention exemplifies the double SOG layer, it is still possible to form a multiple SOG layer. In case of the multiple SOG layer, a high resolution ArF photolithography can be applied by forming the hard mask and the anti-reflective coating layer between the photoresist pattern and the SOG layer as described in the second embodiment.

By following the above described first to the third embodiments of the present invention, it is possible to prevent the SOG layer from being damaged during the wet cleaning process by allowing the SOG layer to be sufficiently densified. As a result of this effect, there is a further effect on minimization of defect generation, thereby enhancing yields of semiconductor devices.

Although the above embodiments show the application of the SAC etching process with use of the line-type photoresist pattern, it is still possible to perform the SAC etching process with use of a hole-type or a T-type photoresist pattern. Also, the contact formation process applied to the gate structures as described in the first to the third embodiments can be applied to form various types of contacts such as a storage node contact and a via contact.

The present application contains subject matter related to the Korean patent application No. KR 2003-0065691, filed in the Korean Patent Office on Sep. 22, 2003, the entire contents of which being incorporated herein by reference.

While the present invention has been described with respect to certain preferred embodiments, it will be apparent to those skilled in the art that various changes and modifications may be made without departing from the spirit and scope of the invention as defined in the following claims.

What is claimed is:

1. A method for fabricating a semiconductor device, comprising the steps of:
    forming a plurality of conductive patterns on a substrate provided with a cell region and a peripheral region;
    forming an etch stop layer on the plurality of conductive patterns and the substrate;
    forming a spin on glass (SOG) layer on the etch stop layer;
    performing a first curing process for densifying the SOG layer;
    partially etching the SOG layer to thereby make a bottom part of the SOG layer densified during a subsequent second curing process;
    performing the second curing process for densifying the SOG layer;
    forming a photoresist pattern on the SOG layer;
    forming a plurality of contact holes by etching the SOG layer with use of the photoresist pattern as an etch mask;
    removing portions of the etch stop layer exposed by the plurality of contact holes to thereby expose the substrate; and
    cleaning the contact holes.

2. The method of claim 1, wherein the step of partially etching the SOG layer continues until the SOG layer reaches a thickness ranging from approximately 3,000 Å to approximately 5,000 Å.

3. The method of claim 1, wherein, at the step of partially etching the SOG layer, the SOG layer in the cell region is etched by using a mask opening the cell region.

4. The method of claim 1, wherein the step of performing the first curing process and the second curing process proceeds at a temperature ranging from approximately 600° C. to approximately 700° C. in an atmosphere of a gas selected from a group consisting of $H_2O$, $O_2$, $N_2$, $H_2$ and $N_2O$ for approximately 10 minutes to approximately 60 minutes.

5. The method of claim 1, further including the step of forming a plurality of plugs electrically connected with the exposed substrate after the step of cleaning the contact holes.

6. The method of claim 5, wherein the step of forming the plurality of plugs includes the steps of:
    forming a conducting layer for forming the plugs such that the conducting layer is electrically connected with the exposed substrate;
    performing an etch-back process for removing a portion of the conducting layer to eliminate a difference in height between the cell region and the peripheral region; and
    forming the plurality of plugs by polishing the conducting layer until an upper portion of the conducting layer is exposed.

7. The method of claim 6, wherein the step of forming the conducting layer proceeds by depositing the conducting layer into the contact holes exposing the substrate.

8. The method of claim 6, wherein the step of forming the conducting layer proceeds by growing the conducting layer from the exposed substrate through the use of a selective epitaxial growth method.

9. The method of claim 1, wherein the photoresist pattern has one of a line-type, a T-type and a hole-type.

10. The method of claim 1, wherein the conductive pattern is one of a gate structure, a bit line and a metal wire.

11. The method of claim 1, wherein the step of forming the contact holes proceeds by employing a self-aligned contact etching process.

12. The method of claim 1, wherein the step of removing the exposed etch stop layer proceeds by employing a blanket etch process.

13. A method for fabricating a semiconductor device, comprising the steps of:
    forming a plurality of conductive patterns on a substrate provided with a cell region and a peripheral region;
    forming an etch stop layer on the plurality of conductive patterns and the substrate;
    forming a first SOG layer on the etch stop layer, the first SOG layer having a thickness allowing a bottom part of the first SOG layer to be densified during a subsequent first curing process;
    performing the first curing process;
    forming a second SOG layer on the first SOG layer, the second SOG layer having a thickness allowing a bottom part of the second SOG layer to be densified during a subsequent second curing process;
    performing the second curing process;
    forming a photoresist pattern on the second SOG layer;
    forming a plurality of contact holes by etching the first and the second SOG layers with use of the photoresist pattern as an etch mask;
    removing portions of the etch stop layer exposed by the plurality of contact holes to thereby expose the substrate; and
    cleaning the contact holes.

14. The method of claim 13, wherein the step of forming the first SOG layer and the second SOG layer continues until the first SOG layer and the second SOG layer have a respective thickness ranging from approximately 3,000 Å to approximately 5,000 Å.

15. The method of claim 13, wherein the step of performing the first curing process and the second curing process proceeds at a temperature ranging from approximately 600° C. to approximately 700° C. in an atmosphere of a gas selected from a group consisting of $H_2O$, $O_2$, $N_2$, $H_2$ and $N_2O$ for approximately 10 minutes to approximately 60 minutes.

16. The method of claim 13, further including the step of forming a plurality of plugs electrically connected with the exposed substrate after the step of cleaning the contact holes.

17. The method of claim 16, wherein the step of forming the plurality of plugs includes the steps of:
forming a conducting layer for forming the plugs such that the conducting layer is electrically connected with the exposed substrate;
performing an etch-back process for removing a portion of the conducting layer to eliminate a difference in height between the cell region and the peripheral region; and
forming the plurality of plugs by polishing the conducting layer until an upper portion of the conducting layer is exposed.

18. The method of claim 17, wherein the step of forming the conducting layer proceeds by depositing the conducting layer into the plurality of contact holes exposing the substrate.

19. The method of claim 17, wherein the step of forming the conducting layer proceeds by growing the conducting layer from the exposed substrate through the use of a selective epitaxial growth method.

20. The method of claim 13, wherein the photoresist pattern has one of a line-type, a T-type and a hole type.

21. The method of claim 13, wherein the conductive pattern is one of a gate structure, a bit line and a metal wire.

22. The method of claim 13, wherein the step of forming the contact holes proceeds by employing a self-aligned contact (SAC) etching process.

23. The method of claim 13, wherein the step of removing the exposed etch stop layer proceeds by employing a blanket etch process.

24. A method for fabricating a semiconductor device, comprising the steps of:
forming a plurality of conductive patterns on a substrate provided with a cell region and a peripheral region;
forming an etch stop layer on the plurality of conductive patterns and the substrate;
forming a SOG layer on the etch stop layer;
performing the first curing process for densifying the SOG layer;
partially etching the SOG layer to thereby make a bottom part of the SOG layer densified during a subsequent second curing process;
performing the second curing process;
forming a layer of a hard mask material and an anti-reflective coating (ARC) layer on the SOG layer;
forming a photoresist pattern on the ARC layer by employing an ArF photolithography;
forming a plurality of contact holes by etching the SOG layer with use of the photoresist pattern as an etch mask;
removing predetermined portions of the etch stop layer exposed by the plurality of contact holes to thereby expose the substrate; and
cleaning the contact holes.

25. The method of claim 24, wherein the step of partially etching the SOG layer continues until the SOG layer has a thickness ranging from approximately 3,000 Å to approximately 5,000 Å.

26. The method of claim 24, wherein, at the step of partially etching the SOG layer, the SOG layer in the cell region is etched by using an etch mask opening the cell region.

27. The method of claim 24, wherein the hard mask material is selected from a group consisting of polysilicon, tungsten, amorphous carbon, and nitride.

* * * * *